United States Patent
Kadan et al.

(10) Patent No.: US 10,797,210 B2
(45) Date of Patent: Oct. 6, 2020

(54) LIGHT EMITTING DEVICE HAVING REDUCED THICKNESS AND INCREASED LIGHT-REFLECTIVITY

(71) Applicant: NICHIA CORPORATION, Anan-shi, Tokushima (JP)

(72) Inventors: Katsuyoshi Kadan, Katsuura-gun (JP); Hajime Washio, Sakurai (JP)

(73) Assignee: NICHIA CORPORATION, Anan-Shi (JP)

(*) Notice: Subject to any disclaimer, the term of this patent is extended or adjusted under 35 U.S.C. 154(b) by 92 days.

(21) Appl. No.: 16/183,662

(22) Filed: Nov. 7, 2018

(65) Prior Publication Data
US 2019/0140151 A1    May 9, 2019

(30) Foreign Application Priority Data
Nov. 8, 2017 (JP) .................. 2017-215146

(51) Int. Cl.
*H01L 33/60* (2010.01)
*H01L 25/075* (2006.01)
*H01L 33/62* (2010.01)

(52) U.S. Cl.
CPC .......... *H01L 33/60* (2013.01); *H01L 25/0753* (2013.01); *H01L 33/62* (2013.01)

(58) Field of Classification Search
CPC ...... H01L 33/60; H01L 33/62; H01L 25/0753
See application file for complete search history.

(56) References Cited

U.S. PATENT DOCUMENTS

2005/0243443 A1    11/2005    Yamamoto et al.
2016/0049567 A1*   2/2016     Palaniswamy .......... H01L 24/17
                                                                257/98

FOREIGN PATENT DOCUMENTS

| JP | 2005-345654 A | 12/2005 |
| JP | 2006-100444 A | 4/2006 |
| JP | 2006-135276 A | 5/2006 |
| JP | 2011-040488 A | 2/2011 |
| JP | 2013-041906 A | 2/2013 |

* cited by examiner

*Primary Examiner* — Matthew E. Gordon
(74) *Attorney, Agent, or Firm* — Foley & Lardner LLP

(57) ABSTRACT

A light emitting device includes: first and second conductive members disposed on an upper surface of a substrate; and a light emitting element disposed above a portion of an upper surface of a first electrode layer and a portion of an upper surface of a second electrode layer, above the spacer region. The upper surface of the first electrode layer and the upper surface of the second electrode layer above spacer region are located lower than the upper surface of the first electrode layer above the first conductive member and the upper surface of the second electrode layer above the second conductive member, and a reflectance of the first conductive member and the second to light emitted from the light emitting element is higher than reflectance of the first electrode layer and the second electrode layer to light emitted from the light emitting element.

9 Claims, 2 Drawing Sheets

LIGHT EMITTING DEVICE HAVING REDUCED THICKNESS AND INCREASED LIGHT-REFLECTIVITY

CROSS-REFERENCE TO RELATED PATENT APPLICATIONS

This application claims priority under 35 U. S. C. § 119 to Japanese Patent Application No. 2017-215146, filed on Nov. 8, 2017, the entire disclosure of which is incorporated herein by reference.

BACKGROUND

The present disclosure relates to a light emitting device. Light emitting devices using light emitting elements such as light emitting diodes are known. Along with the progress made with respect to reduction in thickness and increase in screen size of electric devices, requirements for reduction in thickness and increase in output of light emitting devices have also been increased.

In such a light emitting device, a light emitting element may be disposed on a substrate provided with wiring. For example, Japanese Patent Publication No. 2006-100444 describes a light emitting device in which electrodes on a lower surface of a light emitting element are connected to wirings on an upper surface of a substrate. For the material of the wirings, metal materials such as copper, gold, and aluminum are used. In this light emitting device, providing a metal film having a high reflectance, such as an aluminum film, on an upper surface of the wirings is considered preferable to increase light-reflectivity.

SUMMARY

However, an increase in number of layers in the wirings as described above may hinder reduction in the thickness of the light emitting device. Certain embodiments of the present disclosure advantageously provide a light emitting device of a small size with high light extraction efficiency.

A light emitting device according to one embodiment of the present invention includes: a substrate having an upper surface defining a spacer region partially on the substrate upper surface; a first conductive member and a second conductive member that are disposed on the upper surface of the substrate, spaced apart from each other via the spacer region; a first electrode layer having a first upper surface, the first electrode layer being disposed on a first portion of an upper surface of the first conductive member and onto a first portion of the spacer region; a second electrode layer having a second upper surface, the second electrode layer being disposed on a second portion of an upper surface of the second conductive member and onto a second portion of the spacer region; and a light emitting element disposed on a first portion of the first upper surface of the first electrode layer and a second portion of the second upper surface of the second electrode layer, above the spacer region. A first level of the first upper surface of the first electrode layer above the spacer region and a second level of the second upper surface of the second electrode layer above the spacer region are lower than a third level of the first upper surface of the first electrode layer above the first conductive member and a fourth level of the second upper surface of the second electrode layer above the second conductive member. The first conductive member and the second conductive member have a first reflectance to light emitted from the light emitting element higher than a second reflectance of the first electrode layer and the second electrode layer to light emitted from the light emitting element.

The light emitting device according to certain embodiments of the present invention has a small thickness and has a high light extraction efficiency.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION

Figure 1:
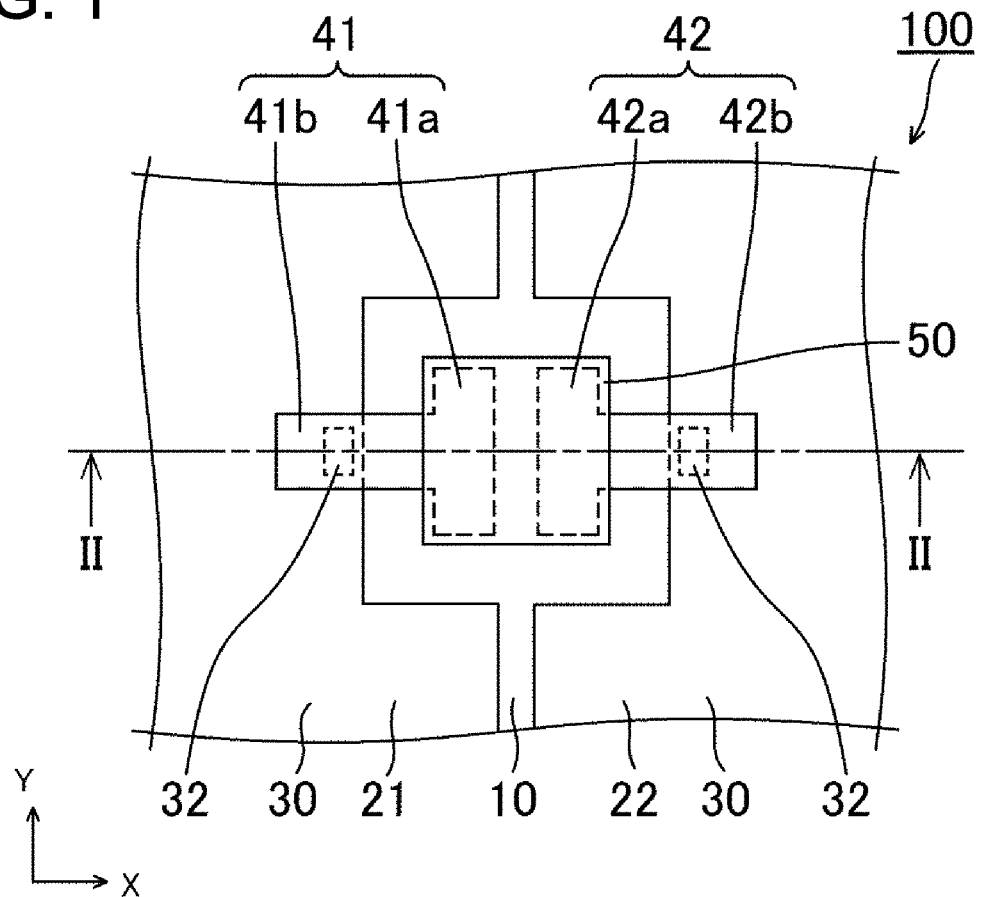
FIG. 1 is a schematic plan view of a light emitting device according to one embodiment of the present invention.

Certain embodiments of the present invention will be described below with reference to the accompanying drawings. It is to be noted that the embodiments described below are intended for implementing the technical concept of the present invention, and the present invention is not limited to those described below unless otherwise specified. The sizes and the positional relationships of the members in the drawings are occasionally shown exaggerated for ease of explanation.

First Embodiment

Figure 2:
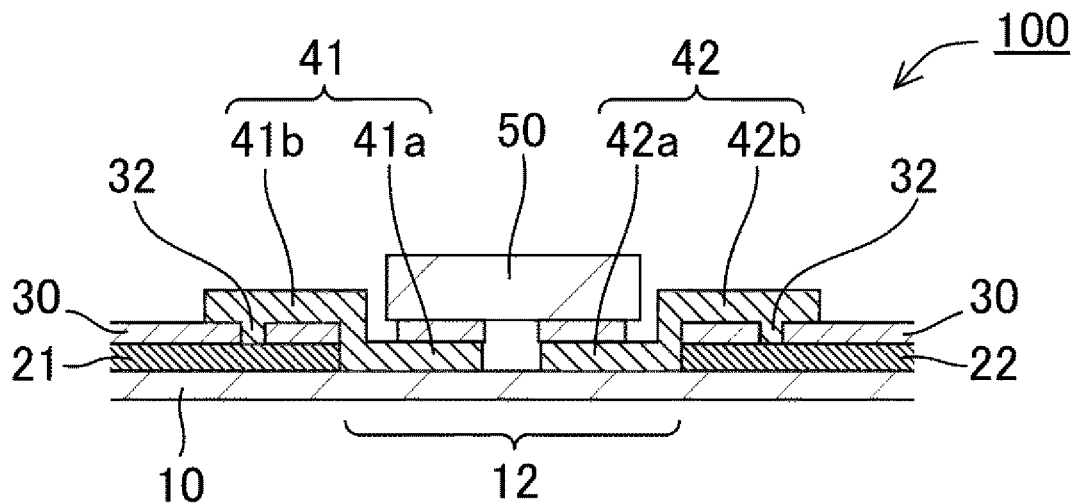
FIG. 2 is a schematic cross-sectional view taken along a line II-II of FIG. 1.

FIG. 1 is a schematic cross-sectional view of a light emitting device 100 according to a first embodiment. FIG. 2 is a schematic cross-sectional view taken along line II-II of FIG. 1.

The light emitting device 100 includes a substrate 10, a first conductive member 21 and a second conductive member 22 that are disposed on an upper surface of the substrate 10, spaced apart from each other via a spacer region 12 corresponding to a portion of the upper surface of the substrate 10, a first electrode layer 41 disposed over a portion of an upper surface of the first conductive member 21 and onto a portion of the spacer region 12 of the substrate 10, a second electrode layer 42 disposed over a portion of an upper surface of the second conductive member 22 and onto a portion of the spacer region of the substrate 10, and a light emitting element 50 disposed above a portion of an upper surface of the first electrode layer 41 and a portion of an upper surface of the second electrode layer 42, above the spacer region 12.

The light emitting element 50 include positive and negative electrodes disposed at the same surface side of the light emitting element 50. The first electrode layer 41 and the second electrode layer 42 are formed as wiring patterns corresponding to the positive and negative electrodes of the light emitting element 50. The light emitting element 50 is mounted in a flip-chip manner directly or via bumps such that the positive and negative electrodes respectively face a portion of the upper surface of the first electrode layer 41 and a portion of the upper surface of the second electrode layer 42, above the spacer region 12.

A portion of the upper surface of the first electrode layer 41 and a portion of the upper surface of the second electrode layer 42 above the spacer region 12 are located lower than a portion of the upper surface of the first electrode layer 41 and a portion of the upper surface of the second electrode layer 42 above the first conductive member 21 and the second conductive member 22. A mounting surface of each of the first electrode layer 41 and the second electrode layer 42 are located lower than a portion of the upper surface of each of the first electrode layer 41 and the second electrode layer 42 above the first conductive member 21 and the second conductive member 22. With this arrangement, a light emitting device 100 with a smaller thickness can be provided. Further, the first conductive member 21 and the second conductive member 22 are made of a material having a reflectance with respect to a light emitted from the light emitting element 50 greater than that of the first electrode layer 41 the second electrode layer 42. With such materials, the light extraction efficiency of the light emitting device 100 can be increased.

The elements of the light emitting device 100 will be described below.

Substrate 10

The substrate 10 is configured to allow the light emitting element 50 to be disposed thereon. The substrate 10 can have any appropriate shape, but preferably has a flat upper surface. For the substrate 10, an insulating material can be used. For example, glass, a ceramic, or a resin is preferably used. The first conductive member 21 and the second conductive member 22 are disposed on the upper surface of the substrate 10.

First Conductive Member 21, Second Conductive Member 22

The first conductive member 21 and the second conductive member 22 are arranged on the upper surface of the substrate 10 with the spacer region 12 between the first conductive member 21 and the second conductive member 22, and are insulated from each other. The spacer region 12 is a region between the first conductive member 21 and the second conductive member 22 on the upper surface of the substrate 10. The spacer region 12 has a width greater than a width of the light emitting element 50. The width of the spacer region 12 is, for example, in a range of 50 μm to 1000 μm. In a top view, the light emitting element 50 is disposed in the spacer region 12. The first conductive member 21 and the second conductive member 22 are arranged to surround the light emitting element 50, and are not located under the light emitting element 50. With this arrangement, a thickness of the light emitting device 100 can be reduced.

The first conductive member 21 and the second conductive member 22 are made of a material having a reflectance with respect to light emitted from the light emitting element 50 greater than that of the first electrode layer 41 and the second electrode layer 42. For the first conductive member 21 and the second conductive member 22, a material containing at least one selected from a group consisting of Al, Ag, Pt, and Rh can be used. Among these, Al, Ag, and an alloy containing Al and/or Ag, which have high reflectances with respect to light emitted from the light emitting element 50, are preferable. In particular, Al is preferable because of having a high reflectance with respect to light emitted from the light emitting element 50 and a high conductivity, which is required for a wiring circuit. The first conductive member 21 and the second conductive member 22 may have any appropriate thickness. Each of the first conductive member 21 and the second conductive member 22 preferably has a thickness of 0.1 μm or more in view of reflectivity, and more preferably has a thickness in a range of 0.1 μm to 5 μm.

The first conductive member 21 has a width greater than a width of the first electrode layer 41 in a direction (i.e., a Y-direction in FIG. 2) perpendicular to a direction in which the first conductive member 21 and the second conductive member 22 are arranged (i.e., an X-direction in FIG. 2). The second conductive member 22 has a width greater than a width of the second electrode layer 42 in the Y-direction. With such widths, the light extraction efficiency of the light emitting device 100 can be increased. The expression "width" as used herein refers to the greatest width of respective component.

First Electrode Layer 41, Second Electrode Layer 42

The first electrode layer 41 electrically connects the first conductive member 21 and the light emitting element 50. The second electrode layer 42 electrically connects the second conductive member 22 and the light emitting element 50. The first electrode layer 41 and the second electrode layer 42 are arranged spaced apart from each other.

The first electrode layer 41 includes a first element mounting portion 41a and a first connecting portion 41b. The first element mounting portion 41a is located at the spacer region 12 on the substrate 10. The first element mounting portion 41a is directly connected to or electrically connected via a bump or the like to a respective one of the positive and negative electrodes of the light emitting element 50. The first connecting portion 41b is disposed above the first conductive member 21 with a first protective film 30 disposed between the first connecting portion 41b and the first conductive member 21, and is connected to the upper surface of the first conductive member 21 through a first through-hole 32 defined in the first protective film 30. In view of light extraction efficiency, the first connecting portion 41b has an area smaller than an area of the first element mounting portion 41a in a top view. As shown in FIG. 2, the first connecting portion 41b has a width smaller than a width of the first element mounting portion 41a in a direction (i.e., the Y-direction in FIG. 2) perpendicular to a direction in which the first conductive member 21 and the second conductive member 22 are arranged (i.e., the X-direction in FIG. 2). Reduction in an area of the first connecting portion 41b allows for increasing an area of a portion of the first conductive member 21 exposed from the first electrode layer 41 in a top view of the light emitting device 100, so that light extraction efficiency can be increased.

The second electrode layer 42 includes a second element mounting portion 42a and a second connecting portion 42b. The second element mounting portion 42a is located at the spacer region 12 on the substrate 10. The second element mounting portion 42a is directly connected or electrically connected via a bump or the like to a respective one of the positive and negative electrodes of the light emitting element 50. The second connecting portion 42b is disposed over the second conductive member 22 via a second protective film 30 disposed on the second conductive member 22, and is connected to the upper surface of the second conductive member 22 through a second through-hole 32 defined in the second protective film 30. In view of light extraction efficiency, the second connecting portion 42b has an area smaller than an area of the second element mounting portion 42a in a top view. As shown in FIG. 2, the second connecting portion 42b has a width smaller than that of the second element mounting portion 42a in the Y-direction. Reduction in the area of the second connecting portion 42b can increase an area of the second conductive member 22 exposed from the second electrode layer 42 in a top view of the light emitting device 100, so that light extraction efficiency can be increased.

An upper surface of the first element mounting portion 41a and an upper surface of the second element mounting portion 42a are located lower than an upper surface of the first connecting portion 41b and an upper surface of the second connecting portion 42b. The light emitting element 50 is mounted on an upper surface of each of the first element mounting portion 41a and the second element mounting portion 42a. Lowering the mounting surface (i.e., the upper surfaces of the first element mounting portion 41a and the second element mounting portion 42a) allows a reduction in a thickness of the light emitting device 100.

For the first electrode layer 41 and the second electrode layer 42, a material having a lower electric resistance is preferable, and a material containing at least one selected from a group consisting of Cu, Au, and Ni can be used. Of those, Cu is preferably used. Further, each of the first electrode layer 41 and the second electrode layer 42 may include an adhesion layer at a lower surface side thereof. Examples of a layered structure of each of the first electrode layer 41 and the second electrode layer 42 include Ti/Cu layered structure. The first electrode layer 41 and the second electrode layer 42 may have any appropriate thickness, and preferably has a thickness in a range of 0.1 µm to 5 µm.

Variant Example of First Electrode Layer 41 and Second Electrode Layer 42

Figure 3:
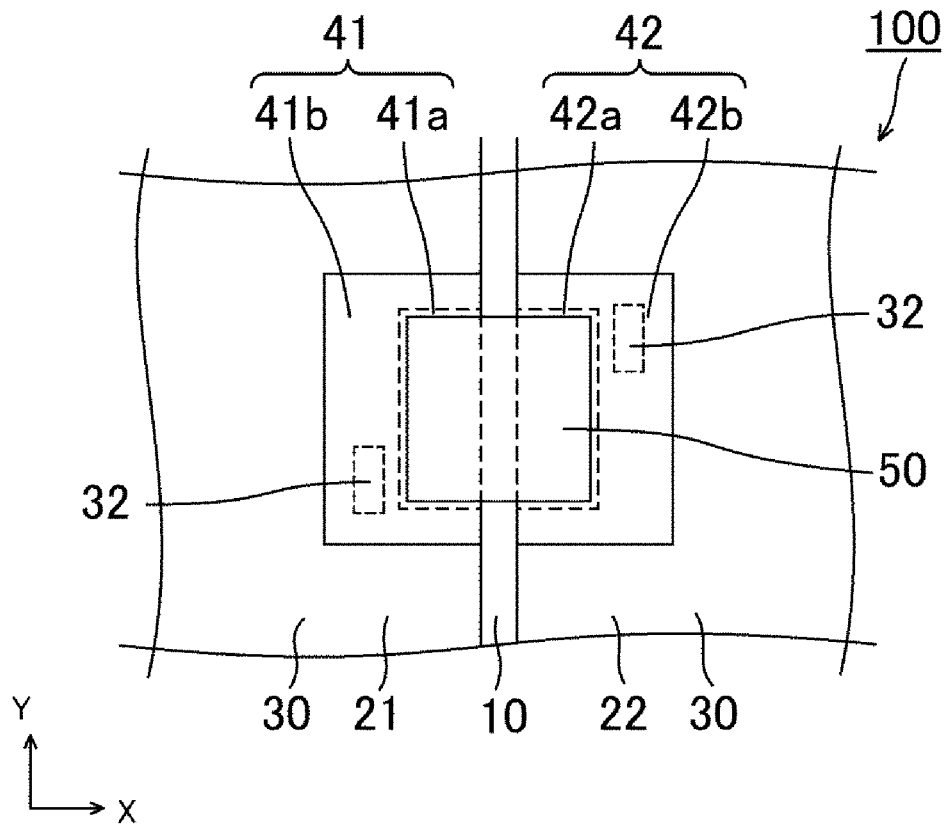
FIG. 3 is a schematic plan view of a variant example of a first electrode layer and a second electrode layer.

FIG. 3 is a schematic plan view of a variant example of a first electrode layer 41 and a second electrode layer 42. In a top view, the first connecting portion 41b may have a width greater than that of the first element mounting portion 41a in the Y-direction. Further, the second connecting portion 42b may have a width greater than that of the second element mounting portion 42a in the Y-direction.

First and Second Protective Film 30

The first and second protective films 30, which are electrically insulating, are preferably disposed on an upper surface of the first conductive member 21 and an upper surface of the second conductive member 22, respectively, to obtain a desired conductivity and insulating property. When the first conductive member 21 and the second conductive member 22 are made of Al, Ag, or the like, the first and second protective films 30 are preferably disposed on the first conductive member 21 and the second conductive member 22, respectively, because with the protective films 30, corrosion of Al, Ag, or the like can be prevented or reduced. The first and second protective films 30 are preferably light-transmissive, and an inorganic film made of $SiO_2$, $TiO_2$, $Al_2O_3$, $Ta_2O_3$, or the like, or an organic film of epoxy or the like can be used. Alternatively, a dielectric multilayer film made of light-transmissive dielectric materials such as a $SiO_2/Nb_2O_3$ film, may be used for the first and second protective films 30. In this case, a dielectric multilayer film that reflects visible light may be used. The first and second protective films 30 may have any appropriate thickness. Preferably each of the first and second protective films 30 has a thickness in a range of, for example, approximately 0.1 µm to 300 µm, and more preferably approximately 0.5 µm to 5 µm.

The first and second protective films 30 define first and second through-holes 32, respectively. The first through-hole 32 is defined in a region where the first conductive member 21 and the first electrode layer 41 overlap. The second through-hole 32 is defined in a region where the second conductive member 22 and the second electrode layer 42 overlap. The first through-hole 32 and the second through-hole 32 are filled with a portion of the first electrode layer 41 and a portion of the second electrode layer 42, respectively. The first conductive member 21 and the first electrode layer 41 are connected via the first through-hole 32 and the second conductive member 22 and the second electrode layer 42 are connected via the second through-hole 32.

Light Emitting Element 50

The light emitting element 50 includes positive and negative electrodes at a same surface side of the light emitting element 50. For the light emitting element 50, a known semiconductor light emitting element made of a nitride semiconductor, etc., can be employed. Further, for the light emitting element 50, a light emitting element having any appropriate wavelength can be selected to obtain a desired emission color.

The light emitting element 50 is mounted over the first electrode layer 41 and the second electrode layer 42. A single light emitting element 50 may be mounted with respect to a pair of the first electrode layer 41 and the second electrode layer 42, or a plurality of light emitting elements 50 may be mounted on a pair of the first electrode layer 41 and the second electrode layer 42.

For the light emitting element 50, a light emitting diode of various emission wavelengths can be used. Also, in order to obtain a desired emission color, the light emitting element 50 may be combined with a phosphor as described below. In particular, in order to obtain white light emission, a nitride semiconductor light emitting element for emitting blue light and a phosphor for absorbing blue light and emitting yellow light, green light, or red light are preferably combined.

Figure 4:
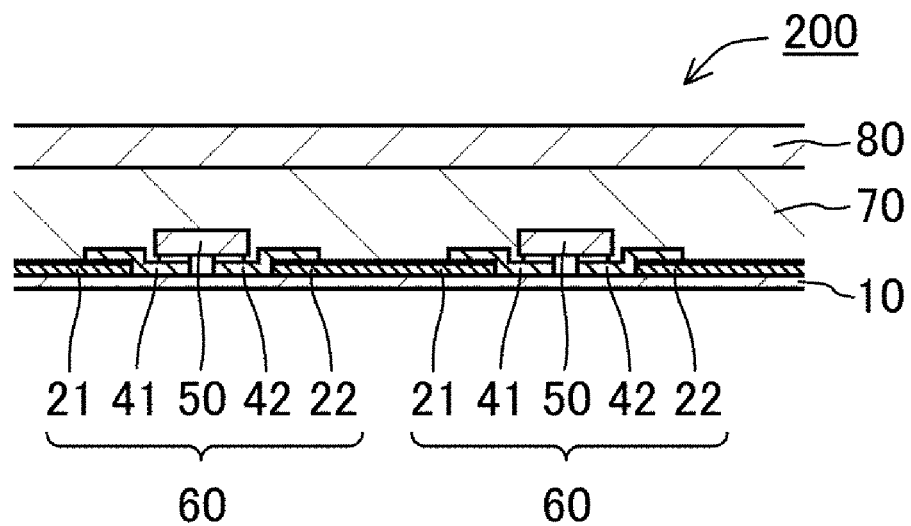
FIG. 4 is a schematic plan view of a light emitting device according to another embodiment of the present invention.

As shown in FIG. 4, in a light emitting device 200, a plurality of light emitting structures 60, each including the light emitting element 50, the first electrode layer 41, the second electrode layer 42, the first conductive member 21, and the second conductive member 22, are disposed with respect to a single substrate 10. In this arrangement, between two light emitting structures 60 adjacent to each other, the first conductive member 21 of one of the two light emitting structures 60 and the second conductive member 22 of the other of the two light emitting structures 60 are integrally formed. Also, the light emitting device 200 further includes a light-transmissive member 70 and a wavelength converting member 80 over the light emitting elements 50.

Light-Transmissive Member 70

The light-transmissive member 70 is preferably disposed between the wavelength converting member 80 and the light emitting elements 50. With this arrangement, light emitted from the light emitting elements 50 can be efficiently incident on the wavelength converting member 80. For the light-transmissive member 70, a transparent resin, glass, etc., can be used. For a transparent resin, a silicone resin can be used in view of durability, ease of molding, and the like.

Wavelength Converting Member 80

The wavelength converting member 80 is disposed on a surface of the light-transmissive member 70. The wavelength converting member 80 contains one or more phosphors adapted to absorb light emitted from the light emitting elements 50 and emit light with different wavelength(s). With this structure, the light emitting device 200 can emit mixed-color light where light emitted from the light emitting elements 50 and light having a wavelength converted by the wavelength converting member 80 are mixed, such as white light, to the outside. By selecting the light emitting elements 50 and the phosphor(s), the color of emitted light can be appropriately adjusted.

As shown in FIG. 4, in the light emitting device 200, a single light-transmissive member 70 and a single wavelength converting member 80 are disposed with respect to the plural number of light-emitting structures 60. Accordingly, the light emitting device 200 of surface emission with a large area can be obtained. The light-transmissive member 70 and the wavelength converting member 80 may be disposed with respect to each of the light emitting structures 60.

Covering Member

A covering member may be disposed surrounding the light emitting element 50. For example, the covering member may be disposed over an upper surface of the first electrode layer 41, an upper surface of the second electrode layer 42, a portion of the first protective film 30 where the first electrode layer 41 is not formed, and a portion of the second protective film 30 where the second electrode layer 42 is not formed.

For the covering member, a resin material containing a light-reflective material can be used. Examples of a resin material used as a base material of the covering member include a silicone resin composite, a modified silicone resin composite, an epoxy resin composite, a modified epoxy resin composite, and an acrylic resin composite. Also, a hybrid resin containing one or more of these resins may be used. For the light-reflective material, titanium oxide, silicon oxide, zirconium oxide, potassium titanate, aluminum oxide, aluminum nitride, boron nitride, mullite, or the like can be used.

It is to be understood that although the present invention has been described with regard to certain embodiments thereof, various other embodiments and variants that are within the scope and spirit of the invention may occur to those skilled in the art, and such other embodiments and variants are intended to be covered by the following claims.

What is claimed is:

1. A light emitting device comprising:
   a substrate having an upper surface comprising a spacer region;
   a first conductive member and a second conductive member that are disposed on the upper surface of the substrate, spaced apart from each other such that the first conductive member and the second conductive member are not disposed on the spacer region of the upper surface of the substrate;
   a first electrode layer having an upper surface, the first electrode layer being disposed on a portion of an upper surface of the first conductive member and on a first portion of the spacer region on which the first conductive member is not disposed;
   a second electrode layer having an upper surface, the second electrode layer being disposed on a portion of an upper surface of the second conductive member and on a second portion of the spacer region on which the second conductive member is not disposed; and
   a light emitting element disposed on a portion of the upper surface of the first electrode layer and a portion of the upper surface of the second electrode layer, above the spacer region,
   wherein a level of the upper surface of the first electrode layer above the spacer region and a level of the upper surface of the second electrode layer above the spacer region are lower than a level of the upper surface of the first electrode layer above the first conductive member and a level of the upper surface of the second electrode layer above the second conductive member, and
   wherein a reflectance of the first conductive member and the second conductive member to light emitted from the light emitting element is higher than a reflectance of the first electrode layer and the second electrode layer to light emitted from the light emitting element.

2. The light emitting device according to claim 1, wherein, in a top view of the light emitting element:
   the first electrode layer comprises:
      a first element mounting portion at the spacer region, and
      a first connecting portion connected to the upper surface of the first conductive member and having an area smaller than an area of the first element mounting portion, and
   the second electrode layer comprises:
      a second element mounting portion at the spacer region, and
      a second connecting portion connected to the upper surface of the second conductive member and having an area smaller than an area of the second element mounting portion.

3. The light emitting device according to claim 1, wherein the light emitting element is mounted in a flip-chip manner.

4. The light emitting device according to claim 1, further comprising:
   a first insulating protective film disposed on the upper surface of the first conductive member and defining a first through-hole; and
   a second insulating protective film disposed on the upper surface of the second conductive member and defining a second through-hole,
   wherein the first conductive member and the first electrode layer are connected via the first through-hole, and
   wherein the second conductive member and the second electrode layer are connected via the second through-hole.

5. The light emitting device according to claim 1,
   wherein a width of the first conductive member is greater than a width of the first electrode layer in a direction perpendicular to a direction in which the first and second conductive members are arranged, and
   wherein a width of the second conductive member is greater than a width of the second electrode layer in the direction perpendicular to the direction in which the first and second conductive members are arranged.

6. The light emitting device according to claim 1,
   wherein the first electrode layer and the second electrode layer contain at least one material selected from a group consisting of Cu, Au, or Ni.

7. The light emitting device according to claim 1,
   wherein the first conductive member and the second conductive member contain at least one material selected from a group consisting of Al, Ag, Pt, and Rh.

8. The light emitting device according to claim 2, wherein, in a top view of the light emitting element, a width of the first connecting portion is smaller than a width of the first element mounting portion, and a width of the second connecting portion is smaller than a width of the second element mounting portion.

9. The light emitting device according to claim 2, wherein, in a top view of the light emitting element, a width of the first connecting portion is greater than a width of the first element mounting portion, and a width of the second connecting portion is greater than a width of the second element mounting portion.

* * * * *